(12) United States Patent
Lee

(10) Patent No.: US 11,201,270 B2
(45) Date of Patent: Dec. 14, 2021

(54) METHOD FOR INCREASING THE LIGHT OUTPUT OF MICROLED DEVICES USING QUANTUM DOTS

(71) Applicant: Nanosys, Inc., Milpitas, CA (US)

(72) Inventor: Ernest C. Lee, Palo Alto, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/773,543

(22) Filed: Jan. 27, 2020

(65) Prior Publication Data

US 2020/0161517 A1    May 21, 2020

Related U.S. Application Data

(62) Division of application No. 15/935,507, filed on Mar. 26, 2018, now Pat. No. 10,546,985.

(60) Provisional application No. 62/477,716, filed on Mar. 28, 2017.

(51) Int. Cl.
| | |
|---|---|
| *H01L 33/60* | (2010.01) |
| *H01L 23/538* | (2006.01) |
| *F21V 9/20* | (2018.01) |
| *H01L 25/075* | (2006.01) |
| *C09K 11/88* | (2006.01) |
| *C09K 11/02* | (2006.01) |
| *H05B 33/14* | (2006.01) |
| *B82Y 20/00* | (2011.01) |
| *H01L 33/50* | (2010.01) |
| *B82Y 40/00* | (2011.01) |
| *H01L 33/44* | (2010.01) |

(52) U.S. Cl.
CPC ............ *H01L 33/60* (2013.01); *C09K 11/025* (2013.01); *C09K 11/883* (2013.01); *F21V 9/20* (2018.02); *H01L 23/5387* (2013.01); *H01L 25/0753* (2013.01); *H05B 33/14* (2013.01); *B82Y 20/00* (2013.01); *B82Y 40/00* (2013.01); *H01L 33/44* (2013.01); *H01L 33/502* (2013.01); *H01L 33/507* (2013.01); *H01L 2933/0041* (2013.01); *H01L 2933/0058* (2013.01); *H01L 2933/0083* (2013.01); *Y10S 977/774* (2013.01); *Y10S 977/818* (2013.01); *Y10S 977/819* (2013.01); *Y10S 977/824* (2013.01); *Y10S 977/892* (2013.01); *Y10S 977/95* (2013.01)

(58) Field of Classification Search
CPC ........................................................ F21V 9/20
See application file for complete search history.

(56) References Cited

U.S. PATENT DOCUMENTS

| | | | | |
|---|---|---|---|---|
| 2007/0262714 | A1* | 11/2007 | Bylsma | ................ G01N 21/278 313/512 |
| 2011/0141734 | A1* | 6/2011 | Li | ............................ F21K 9/69 362/235 |
| 2014/0022638 | A1* | 1/2014 | Wu | ...................... G02B 5/3058 359/483.01 |

(Continued)

*Primary Examiner* — Walter H Swanson
(74) *Attorney, Agent, or Firm* — Sterne, Kessler, Goldstein & Fox P.L.L.C.

(57) ABSTRACT

Illumination devices based on quantum dot technology and methods of making such devices are described. An illumination device includes a substrate having a plurality of microLEDs, a beam splitter, and a film having a plurality of quantum dots. The beam splitter includes a plurality of layers and is disposed between the substrate and the film having the plurality of quantum dots.

20 Claims, 6 Drawing Sheets

(56) References Cited

U.S. PATENT DOCUMENTS

2014/0339495 A1* 11/2014 Bibl ................... H01L 33/504
 257/13
2016/0340553 A1* 11/2016 Eckert ................... B32B 27/18

\* cited by examiner

METHOD FOR INCREASING THE LIGHT OUTPUT OF MICROLED DEVICES USING QUANTUM DOTS

CROSS REFERENCE TO RELATED APPLICATIONS

This application is a divisional of U.S. patent application Ser. No. 15/935,507, filed Mar. 26, 2018, which claims the benefit of U.S. Provisional Application No. 62/477,716, filed Mar. 28, 2017, each of which is incorporated by reference herein in its entirety.

BACKGROUND

Field

The present application relates to display devices including highly luminescent quantum dots (QDs) comprising a core-shell structure.

Background

Quantum dots may be used in display devices to produce vibrant colors, and with decreased cost due to using less electronics. Typically, red, green, and blue light sources must all be used to produce the various colors on the screen, or a white light source is used along with various color filtering methods to produce the gamut of colors. Both methods require extensive electronics and become especially expensive in larger displays.

Quantum dots (QDs) have the unique ability to emit light at a single spectral peak with narrow line width, creating highly saturated colors. It is possible to tune the emission wavelength based on the size of the QDs. This ability to tune the emission wavelength enables display engineers to custom engineer a spectrum of light to maximize both the efficiency and color performance of the display.

The size-dependent properties of QDs are used to produce a QD film. The QD film may be used as a color down conversion layer in display devices. The use of a color down conversion layer in emissive displays can improve the system efficiency by down-converting white or blue light to a more reddish light, greenish light, or both, before the light passes through a color filter. This use of a color down conversion layer may reduce loss of light energy due to filtering.

QDs may be used as the conversion material due to their broad absorption and narrow emission spectra. However, QDs emit light isotropically (i.e., in all directions), and as such, much of the emitted light is not directed towards the front of the display device to be viewed. This limits the light output of the device and its overall efficiency.

SUMMARY

Accordingly, there is need to increase the quality of display devices. Disclosed herein are embodiments that may be used to overcome the above mentioned limitations of display devices, and specifically limitations that may arise when using quantum dots in display devices based on microLED technology.

According to an embodiment, an illumination device includes a substrate having a plurality of microLEDs, a beam splitter, and a film having a plurality of quantum dots. The beam splitter includes a plurality of layers and is disposed between the substrate and the film.

According to an embodiment, each of the plurality of microLEDs emits light only in the blue wavelength range.

According to an embodiment, the substrate is a flexible substrate.

According to an embodiment, the film includes a first layer, a second layer, and an adhesive material disposed between the first layer and the second layer, the adhesive material comprising the quantum dots.

According to an embodiment, the plurality of layers are arranged such that the beam splitter transmits at least 90% of light having a wavelength between 400 nm and 480 nm and reflects at least 90% of light having a wavelength between 500 nm and 800 nm.

According to an embodiment, the plurality of layers of the beam splitter includes titanium dioxide, tantalum pentoxide, or silicon dioxide.

According to an embodiment, the beam splitter has a thickness between 1 µm and 50 µm.

According to an embodiment, the substrate is a die having a surface area less than 750 $cm^2$.

According to an embodiment, the plurality of quantum dots include quantum dots that emit light in the green wavelength range and quantum dots that emit light in the red wavelength range.

According to an embodiment, the beam splitter includes a compound laminate structure that includes the plurality of layers.

According to an embodiment, a method of fabricating an illumination device includes forming a plurality of microLEDs on a substrate and disposing a beam splitter over the plurality of microLEDs. The beam splitter includes a plurality of stacked layers. The method further includes disposing a film that includes a plurality of quantum dots over the beam splitter.

According to an embodiment, disposing the beam splitter includes depositing layers of material using chemical vapor deposition (CVD).

According to an embodiment, disposing the beam splitter includes depositing layers of material using atomic layer deposition (ALD).

According to an embodiment, the material deposited by either CVD or ALD includes titanium dioxide, tantalum pentoxide, or silicon dioxide.

According to an embodiment, the forming includes forming the plurality of microLEDs in an array.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

Figure 1:
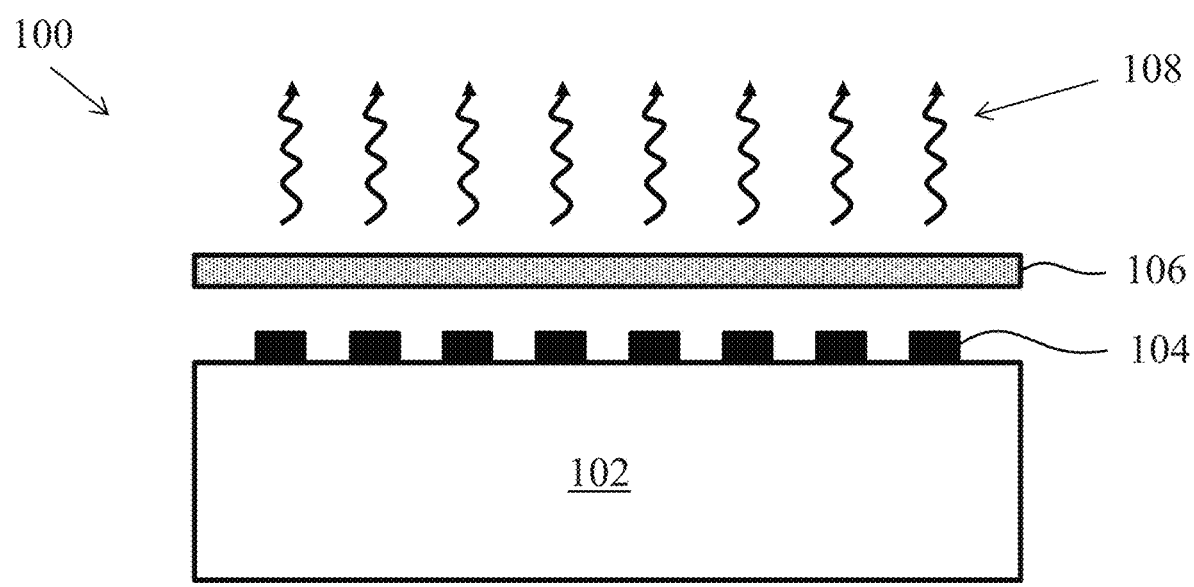
FIG. 1 illustrates an example illumination device using a layer of quantum dots (QDs).

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

The term "about" as used herein indicates the value of a given quantity varies by ±10% of the value, or optionally ±5% of the value, or in some embodiments, by ±1% of the value so described. For example, "about 100 nm" encompasses a range of sizes from 90 nm to 110 nm, inclusive.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g., it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (or QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

Quantum Dot Illumination Devices

FIG. 1 illustrates an example illumination device 100. Illumination device 100 includes a plurality of light sources 104 on a substrate 102, and a quantum dot (QD) film 106 disposed over light sources 104. Details of QD film 106 and the QDs within QD film 106 are provided later, and are not the focus of the embodiments described herein. Light sources 104 may be light emitting diodes (LEDs) that emit light at a lower wavelength (i.e., higher energy) than the emitted light from the quantum dots in QD film 106. For example, light sources 104 may emit light in the blue wavelength range (i.e., one or more wavelengths between about 440 nm and about 470 nm) while the QDs within QD film 106 include a first plurality of QDs that absorb the blue light and emit light in the green wavelength range (i.e., one or more wavelengths between about 520 nm and about 550 nm), and a second plurality of QDs that absorb the blue light and emit light in the red wavelength range (i.e., one or more wavelengths between about 620 nm and about 650 nm.)

As a result of the light conversion performed by the QDs, the emitted light 108 includes light in the blue wavelength range from light sources 104 that was not absorbed by QD film 106, and light in both the green and red wavelength ranges emitted from the QDs within QD film 106. The three primary colors are thus produced and may be filtered and combined downstream to produce any color. The filtering components are not shown for clarity, and are not critical with regards to the present embodiments.

The illumination configuration of FIG. 1 suffers from optical losses due to unwanted scattering and absorption. The isotropic emission of the QDs within QD film 106 means that roughly half of the emitted light is directed back towards substrate 102 where it is either absorbed or scattered by substrate 102 and light sources 104. As a result, the overall efficiency of the illumination device is decreased due to the loss of usable emitted light.

Figure 2:
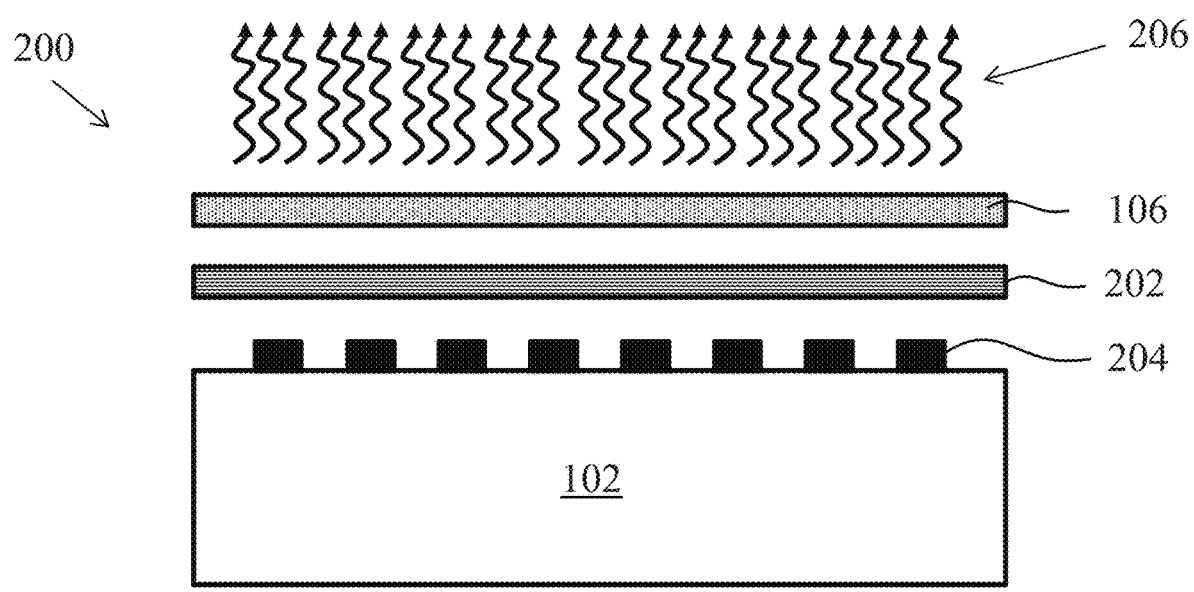
FIG. 2 illustrates an example illumination device using a layer of QDs and a beam splitter, according to an embodiment.

FIG. 2 illustrates an illumination device 200, according to an embodiment. Illumination device 200 includes a beam splitting element 202 between QD film 106 and an array of light sources 204. Light sources 204 may be designed such that they only emit light in the blue wavelength range. Beam splitting element 202 may be a dichroic beam splitter that includes a plurality of stacked material layers chosen in such a way to allow certain wavelengths to pass through while reflecting other wavelengths. In this illustrated embodiment, beam splitting element 202 is a removable element, such as a compound laminate structure, that includes the stacked material layers. In another example, beam splitting element 202 comprises a plurality of stacked thin films formed from extruded polymer layers, such as acrylic polymers. The total thickness of the stacked thin films may be less than 100 μm, thus allowing beam splitting element 202 to be highly flexible.

Beam splitting element 202 may be designed such that it allows light in the blue wavelength range to pass through while reflecting light in the red and green wavelength ranges. For example, the transmission spectra of beam splitting element 202 includes between 95% and 100% transmission of wavelengths less than about 490 nm, and less than 3% transmission of wavelengths greater than about 500 nm. For the wavelengths greater than about 500 nm, nearly all of the light is reflected. Given these optical properties, light in the blue wavelength range generated from light sources 204 will pass through beam splitting element 202 with low loss, while light in the red and green wavelength ranges emitted from the QDs within QD film 106 will be reflected back towards the front end of illumination device 200 (e.g., towards the user in the example where illumination device 200 is a display). As a result, emitted light 206 has a much greater light output compared to emitted light 108 from FIG. 1. The overall efficiency of illumination device 200 may be increased by over 80% compared to illumination device 100 due to the presence of beam splitting element 202.

Figure 3:
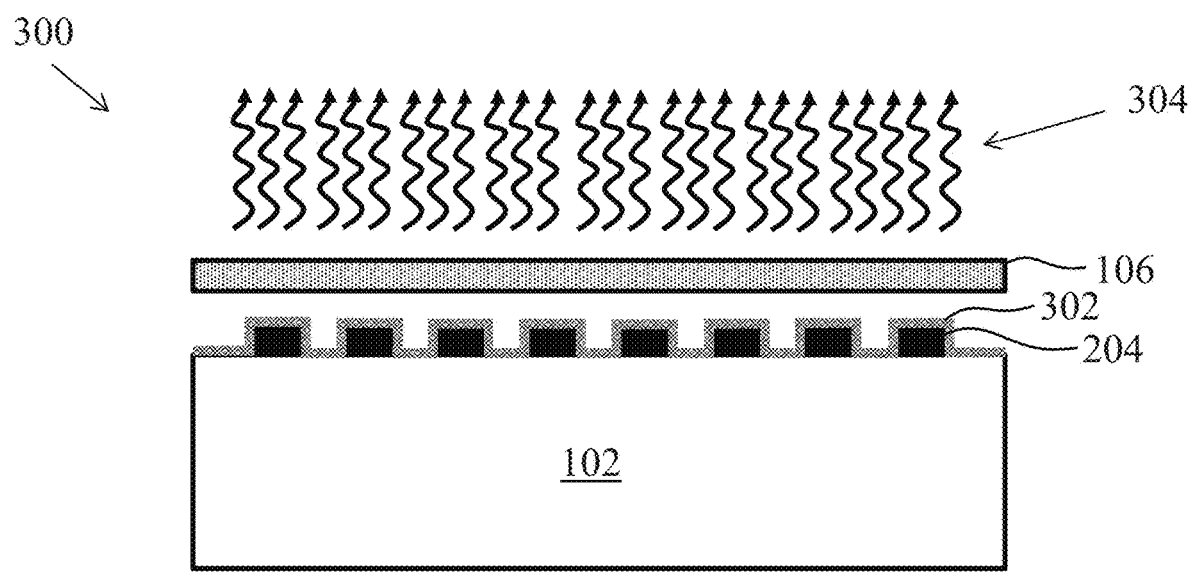
FIG. 3 illustrates another example illumination device using a layer of QDs and a beam splitter, according to an embodiment.

FIG. 3 illustrates another illumination device 300, according to an embodiment. Illumination device 300 includes QD film 106 and light sources 204, with a thin film beam splitter 302 deposited over substrate 102 and light sources 204. Thin film beam splitter 302 may represent a plurality of stacked thin films designed to allow certain wavelengths to pass through while reflecting other wavelengths. Thin film beam splitter 302 may include similar optical properties to beam splitting element 202. A total thickness of thin film beam splitter 302 may be between about 1 μm and 50 μm. As a result of using thin film beam splitter 302, emitted light 304 has a much greater light output compared to emitted light 108 from FIG. 1.

Thin film beam splitter 302 may be deposited over substrate 102 and light sources 204 using a variety of methods. In one example, thin film beam splitter 302 is deposited using atomic layer deposition (ALD). In another example, thin film beam splitter 302 is deposited using chemical vapor deposition (CVD). The CVD process may be plasma-enhanced (PECVD) or performed at a lower pressure than a typical CVD process (LPCVD). In yet another example, thin film beam splitter 302 is deposited using sputtering. Any of the example techniques may be used to sequentially deposit each material layer to create a stack of layers that make up thin film beam splitter 302.

Both thin film beam splitter 302 and beam splitting element 202 may be impractical to use for large display devices, such as large-screen televisions and monitors. This is due primarily to the high cost of fabricating such elements and to the limitations with depositing thin film beam splitter 302 over a large area. Accordingly, illumination device 200 and illumination device 300 may be utilized in smaller electronic screens, such as those found on wristwatches, cellphones, PDAs, remote controls, portable gaming systems, and toys to name a few examples. In one embodiment, a surface area of substrate 102 (i.e. the die size) may be less than about 750 cm$^2$, less than about 500 cm$^2$, or less than about 100 cm$^2$. In an embodiment, substrate 102 is a flexible substrate made from a polymer material such as polyester (PET), polyimide (PI), polyethylene naphthalate (PEN), or polyetherimide (PEI) to name a few examples.

The optical properties of both thin film beam splitter 302 and beam splitting element 202 may be highly dependent on temperature. As such, the heat generated from light sources 204 may adversely affect the ability for thin film beam splitter 302 and beam splitting element 202 to perform as intended. Typical LEDs generate too much heat to be used as light sources 204. According to an embodiment, light sources 204 include a plurality of microLEDs. MicroLEDs are different from typical LEDs or organic light emitting diodes (OLEDs). MicroLEDs are fabricated in an arrayed format with each individual microLED having a largest dimension in a range between about 1 μm and about 10 μm. MicroLEDs are also fabricated primarily from gallium nitride (GaN) or indium gallium nitride (InGaN). Due to their small size and design, microLEDs dissipate far less heat, and thus can be used effectively with either thin film beam splitter 302 or beam splitting element 202 without adversely affecting their optical properties. Example fabrication details for microLEDs may be found in U.S. Pat. No. 9,019,595, the disclosure of which is incorporated herein by reference.

One advantage to using thin film beam splitter 302 is that its fabrication process can be integrated with the fabrication process of the microLEDs. For example, the microLEDs and the thin film layers that make up thin film beam splitter 302 may be fabricated using similar process tools, making the overall fabrication less expensive and less complex.

Figure 4:
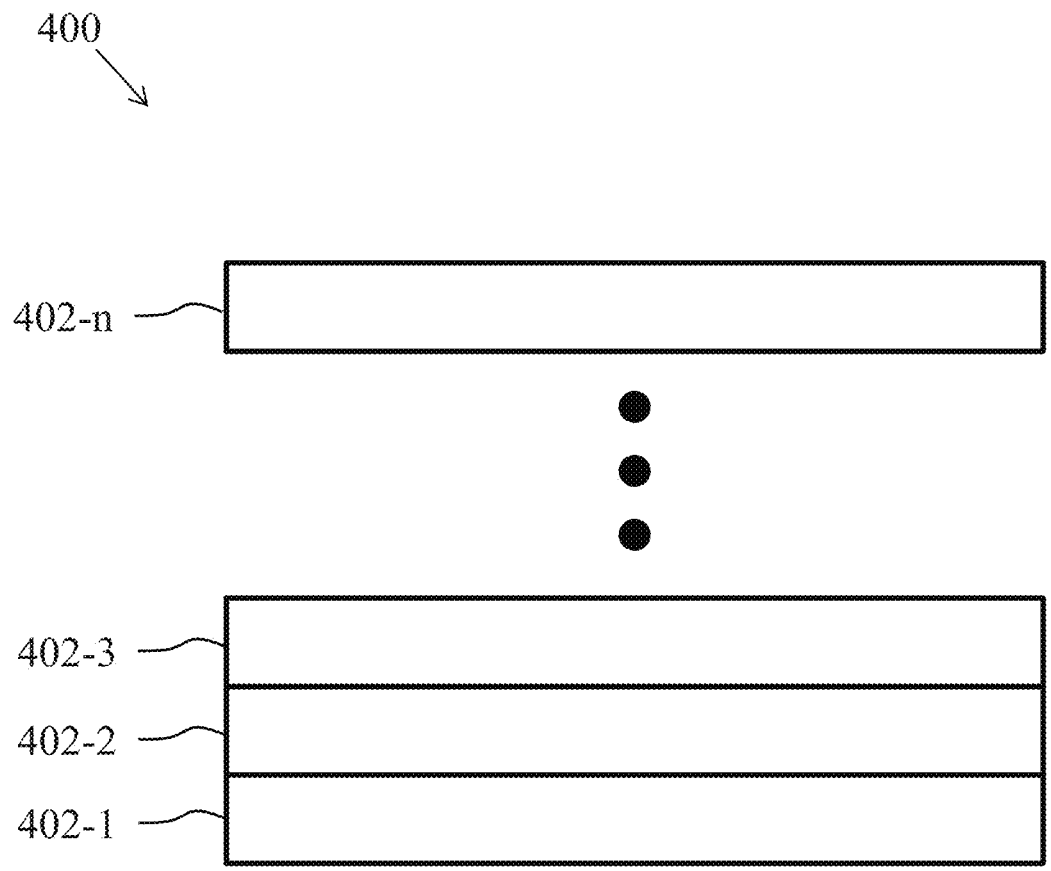
FIG. 4 illustrates a layer structure of a beam splitter, according to an embodiment.

FIG. 4 illustrates an example beam splitter 400, according to an embodiment. Beam splitter 400 may represent either thin film beam splitter 302 or beam splitting element 202. Beam splitter 400 includes a plurality of layers with the lowest layer identified as layer 402-1 and the upper-most layer identified as layer 402-n. The thickness and index of refraction of each of layers 402-1 through 402-n is chosen to provide the optical properties of beam splitter 400. According to an embodiment, beam splitter 400 includes alternating material layers of high and low refractive index. According to an embodiment, beam splitter 302 includes between 50 and 500 layers, with each layer having a thickness ranging between about 50 nm and about 100 nm. Example materials used for each layer 402-1 to 402-n include titanium dioxide (TiO$_2$), tantalum pentoxide (Ta$_2$O$_5$), and silicon dioxide (SiO$_2$).

According to an embodiment, the refractive index and thickness of each of layers 402-1 to 402-n is chosen to cause beam splitter 400 to transmit light having a wavelength less than about 490 (e.g., light in the blue wavelength range), while reflecting light having a wavelength greater than about 500 nm (e.g., light in the red and green wavelength ranges).

Figure 5:
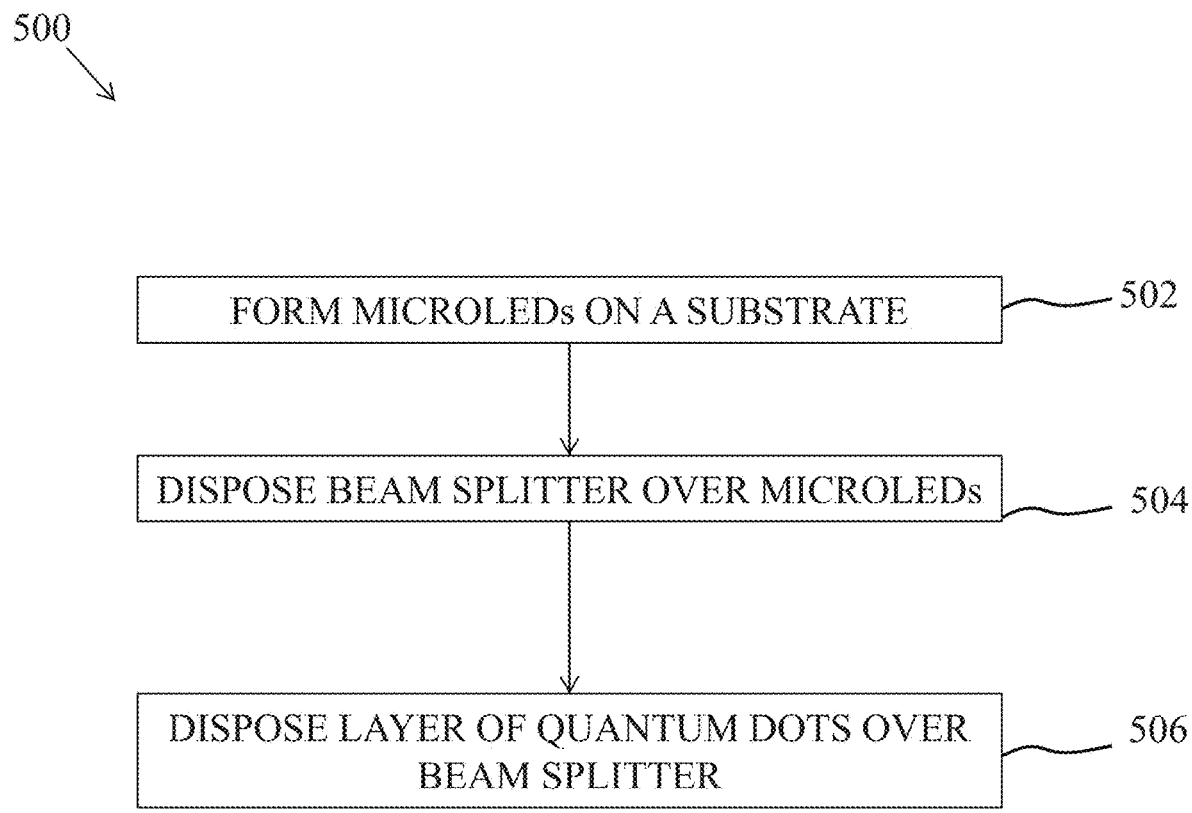
FIG. 5 is a flowchart for fabricating an illumination device, according to an embodiment.

FIG. 5 illustrates an example fabrication method 500 for an illumination device. Method 500 may be performed as part of a larger process for manufacturing an electronic device. Method 500 is not intended to be exhaustive and other steps may be performed without deviating from the scope or spirit of the invention. Furthermore, the various steps of method 500 may be performed in a different order than that illustrated.

At step 502, microLEDs are formed on a substrate. The substrate may be a semiconducting substrate. The substrate may be flexible. The microLEDs may be formed in an array with each microLED pixel having a largest dimension between about 1 μm and 10 μm.

At step 504, a beam splitter is disposed over the microLEDs. The beam splitter may be a separate element, such as a laminate compound or extruded polymer material containing multiple film layers, or the beam splitter may be a stack of sequentially deposited layers over the microLEDs. The layers may be deposited using a variety of techniques, such as ALD, CVD, and sputtering.

At step 506, a layer of quantum dots is disposed over the beam splitter. The layer of quantum dots may be provided in a quantum dot enhancement film (QDEF) as described in more detail later. The layer of quantum dots may be provided as a separate element, or it may be a deposited layer over the beam splitter. For example, the QDs may be suspended in an amino silicone liquid and either spin-coated or cast over the beam splitter. Further materials that may be used to suspend the QDs are discussed in more detail later.

An Example Embodiment of a QD Structure

Provided herein is description of an example structure for a single QD. Such QDs may be used within QD film 106.

Figure 6:
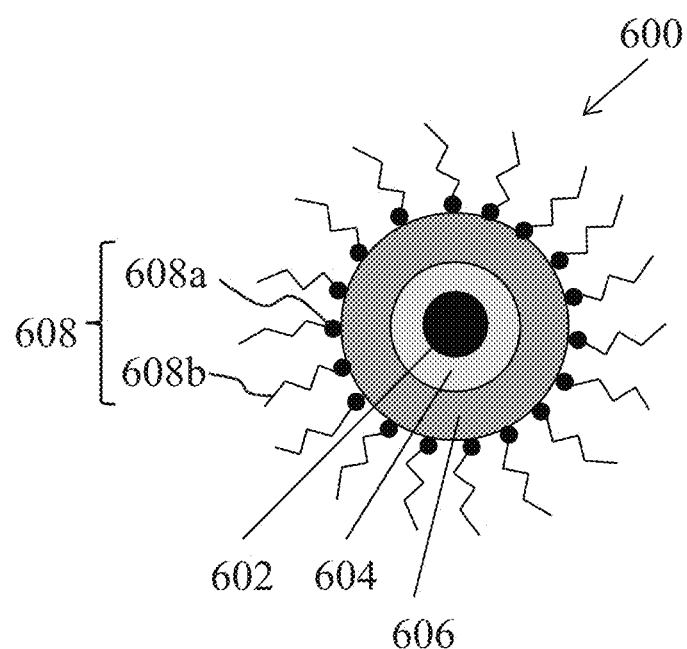
FIG. 6 illustrates an example structure of a QD, according to an embodiment.

FIG. 6 illustrates a cross-sectional structure of a barrier layer coated QD 600, according to an embodiment. Barrier layer coated QD 600 includes a QD 601 and a barrier layer 606. QD 601 includes a core 602 and a shell 604. Core 602 includes a semiconducting material that emits light upon absorption of higher energies. Examples of the semiconducting material for core 602 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 602 may also include one or more dopants such as, metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 602 may improve structural and optical stability and quantum yield (QY) of QD 601 compared to undoped QDs.

Core 602 may have a size of less than 20 nm in diameter, according to an embodiment. In another embodiment, core 602 may have a size between about 1 nm and about 5 nm in diameter. The ability to tailor the size of core 602, and consequently the size of QD 601 in the nanometer range enables photoemission coverage in the entire optical spectrum. In general, the larger QDs emit light towards the red end of the spectrum, while smaller QDs emit light towards the blue end of the spectrum. This effect arises as larger QDs have energy levels that are more closely spaced than the smaller QDs. This allows the QD to absorb photons containing less energy, i.e. those closer to the red end of the spectrum.

Shell 604 surrounds core 602 and is disposed on outer surface of core 602. Shell 604 may include cadmium sulfide (CdS), zinc cadmium sulfide (ZnCdS), zinc selenide sulfide (ZnSeS), zinc selenide (ZnSe), and zinc sulfide (ZnS). In an embodiment, shell 604 may have a thickness of, for example, one or more monolayers. In other embodiments, shell 604 may have a thickness between about 1 nm and about 5 nm. Shell 604 may be utilized to help reduce the lattice mismatch with core 602 and improve the QY of QD 601. Shell 604 may also help to passivate and remove surface trap states, such as dangling bonds, on core 602 to increase QY of QD 601. The presence of surface trap states may provide non-radiative recombination centers and contribute to lowered emission efficiency of QD 601.

In alternate embodiments, QD 601 may include a second shell disposed on shell 604, or more than two shells surrounding core 602, without departing from the spirit and scope of the present invention. In an embodiment, the second shell may be on the order of two monolayers thick and is typically, though not required, also a semiconducting material. Second shell may provide protection to core 602. Second shell material may be zinc sulfide (ZnS) or zinc selenide (ZnSe), although other materials may be used as well without deviating from the scope or spirit of the invention.

Barrier layer 606 is configured to form a coating on QD 601. In an embodiment, barrier layer 606 is disposed on and in substantial contact with outer an outer surface of shell 604. In embodiments of QD 601 having one or more shells, barrier layer 606 may be disposed on the outermost shell of QD 601. In an example embodiment, barrier layer 606 is configured to act as a spacer between QD 601 and one or more QDs in, for example, a solution, a composition, and/or a film having a plurality of QDs, where the plurality of QDs may be similar to QD 601 and/or barrier layer coated QD 600. In such QD solutions, QD compositions, and/or QD films, barrier layer 606 may help to prevent aggregation of QD 601 with adjacent QDs. Aggregation of QD 601 with adjacent QDs may lead to increase in size of QD 601 and consequent reduction or quenching in the optical emission properties of the aggregated QD (not shown) including QD 601. As discussed above, optical characteristics of QDs are size dependent, and thus increase in QD size due to aggregation leads to the quenching phenomenon. Barrier layer 606 may also prevent QD 601 from reabsorbing optical emissions from other QDs in the QD solutions, QD compositions, and/or QD films and thus, improve the QY of these QD solutions, QD compositions, and/or QD films. In further embodiments, barrier layer 606 provides protection to QD 601 from, for example, moisture, air, and/or harsh environments (e.g., high temperatures and chemicals used during lithographic processing of QDs and/or during manufacturing process of QD based devices) that may adversely affect the structural and optical properties of QD 601.

Barrier layer 606 includes one or more materials that are amorphous, optically transparent and/or electrically inactive. Suitable barrier layers include inorganic materials, such as, but not limited to, inorganic oxides and/or nitrides.

Examples of materials for barrier layer 606 include oxides and/or nitrides of Al, Ba, Ca, Mg, Ni, Si, Ti, or Zr, according to various embodiments. Barrier layer 606 may have a thickness ranging from about 8 nm to about 15 nm in various embodiments. In some embodiments, the thickness of barrier layer 606 may have a minimum value such that a center-to-center distance between two adjacent QDs 600, for example, in a solution, composition, and/or film is equal to or greater than a Forster radius (also referred in the art as Forster distance) in order to reduce or substantially eliminate resonance energy transfer and/or reabsorption of optical emission between the adjacent QDs 600, and consequently, improve QY of the adjacent QDs 600. In some embodiments, the thickness of barrier layer 606 may have a minimum value of between about 8 nm to about 15 nm.

Forster radius may refer to a center-to-center distance between two adjacent QDs, such as QDs 600 at which resonance energy transfer efficiency between these two adjacent QDs is about 50%. Having a center-to-center distance between two adjacent QDs greater than the Forster radius may decrease the resonance energy transfer efficiency and improve the optical emission properties and QY of the adjacent QDs. The process of resonance energy transfer can take place when one QD in an electronically excited state transfers its excitation energy to a nearby or adjacent QD. The resonance energy transfer process is a non-radiative quantum mechanical process. Thus, when the resonance energy transfer occurs from the one QD, the optical emission properties of the one QD may be quenched and the QY of the one QD may be adversely affected.

As illustrated in FIG. 6, barrier layer coated QD 600 may additionally or optionally include a plurality of ligands or surfactants 608, according to an embodiment. Ligands or surfactants 608 may be adsorbed or bound to an outer surface of barrier layer coated QD 600, such as on an outer surface of barrier layer 606, according to an embodiment. The plurality of ligands or surfactants 608 may include hydrophilic or polar heads 608*a* and hydrophobic or non-polar tails 608*b*. The hydrophilic or polar heads 608*a* may be bound to barrier layer 606. The presence of ligands or surfactants 608 may help to separate QD 600 and/or QD 601 from other QDs in, for example, a solution, a composition, and/or a film during their formation. If the QDs are allowed to aggregate during their formation, the quantum efficiency of QDs such as QD 600 and/or QD 601 may drop and quench the optical emission properties of these QDs. Ligands or surfactants 608 may also be used to impart certain properties to barrier layer coated QD 600, such as hydrophobicity to provide miscibility in non-polar solvents, or to provide reaction sites (e.g., reverse micellar systems) for other compounds to bind.

A wide variety of ligands exist that may be used as ligands 608. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 608. Nonionic surfactants may be used as surfactants 608. Some examples of nonionic surfactants include polyoxyethylene nonylphenylether (commercial name IGEPAL CO-520), IGEPAL CO-630, IGEPAL CA-630, and Arkopal N 100.

In some embodiments, QDs 601 and/or 600 may be synthesized to emit light in the red, orange, and/or yellow range. In some embodiments, QDs 601 and/or 600 may be synthesized emit light in the green and/or yellow range. In some embodiments, QDs 601 and/or 600 may be synthesized emit light in the blue, indigo, violet, and/or ultra-violet range. In some embodiments, QDs 601 and/or 600 may be synthesized to have a primary emission peak wavelength between about 605 nm and about 650 nm, between about 510 nm and about 550 nm, or between about 300 nm and about 480 nm.

QDs 601 and/or 600 may be synthesized to display a high QY. In some embodiments, QDs 601 and/or 600 may be synthesized to display a QY between 80% and 95% or between 85% and 90%.

Thus, according to various embodiments, QDs 600 may be synthesized such that the presence of barrier layer 606 on QDs 601 does not substantially change or quench the optical emission properties of QDs 601.

QY of QDs may be calculated using an organic dye as a reference (e.g., rhodamine 640 as a reference for red-emitting QDs 601 and/or 600 at the 540 nm excitation wavelength, fluorescein dye as a reference for green-emitting QDs 601 and/or 600 at the 440 nm excitation wavelength, diphenylanthracene as a reference for blue-emitting QDs 601 and/or 600 at the 355 nm excitation wavelength) based on the following equation:

$$\Phi_X = \Phi_{ST}\left(\frac{Grad_X}{Grad_{ST}}\right)\left(\frac{\eta_X^2}{\eta_{ST}^2}\right).$$

The subscripts ST and X denote the standard (reference dye) and the core/shell QDs solution (test sample), respectively. $\Phi_X$ is the quantum yield of the core/shell QDs, and $\Phi_{ST}$ is the quantum yield of the reference dye. Grad=(I/A), where I is the area under the emission peak (wavelength scale); A is the absorbance at excitation wavelength. $\eta$ is the refractive index of the reference dye or the core/shell QDs in the solvent. See, e.g., Williams et al. (1983) "Relative fluorescence quantum yields using a computer controlled luminescence spectrometer" *Analyst* 108:1067. The references listed in Williams et al. are for green and red emitting QDs.

An Example Quantum Dot Enhancement Film

Figure 7:
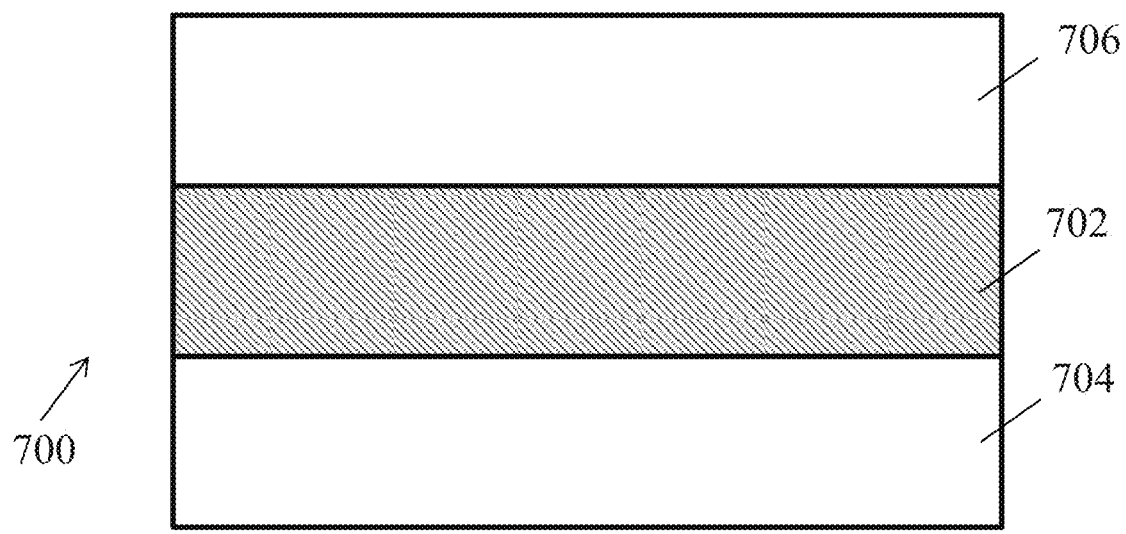
FIG. 7 illustrates an example QD film, according to an embodiment.

FIG. 7 illustrates an example of a quantum dot enhancement film (QDEF) 700. QDEF 700 is one example of QD film 106. Quantum dot enhancement film 700 includes a bottom layer 704, a top layer 706, and a quantum dot layer 702 sandwiched between.

Bottom layer 704 and top layer 706 may be a variety of materials that are substantially transparent to visible wavelengths (e.g., 400-700 nm.) For example, bottom layer 704 and top layer 706 may be glass or polyethylene terephthalate (PET). Bottom layer 704 and top layer 706 may also by polyester coated with aluminum oxide. Other polymers may be used as well that exhibit low oxygen permeability and low absorption for the wavelengths being emitted by the quantum dots trapped within quantum dot layer 702. It is not necessary that bottom layer 704 and top layer 706 be comprised of the same material.

Quantum dot layer 702 includes a plurality of quantum dots within an adhesive material. According to an embodiment, quantum dot layer 702 has a thickness between about 50 and 150 micrometers (μm) and is used as a light down conversion layer. Quantum dot layer 702 may have a thickness around 100 μm. The adhesive material binds to both bottom layer 704 and top layer 706, holding the sandwich-like structure together.

In an embodiment, the plurality of quantum dots includes sizes that emit in at least one of the green and red visible wavelength spectrums. The quantum dots are protected in quantum dot layer 702 from environmental effects and kept separated from one another to avoid quenching. The quantum dots may be spatially separated by enough distance such that quenching processes like excited state reactions, energy transfer, complex-formation and collisional quenching do not occur.

In one example, quantum dots are mixed within an amino silicone liquid and are emulsified into an epoxy resin that is coated to form quantum dot layer 702. Other example materials for use in quantum dot layer 702 include acrylates, epoxies, acrylated epoxies, ethylene-vinyl acetate, thiol-enes, polyurethane, polyethers, polyols, and polyesters. Further details regarding the fabrication and operation of quantum dot enhancement films may be found in U.S. Pat. No. 9,199,842, the disclosure of which is incorporated herein by reference.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of fabricating an illumination device, the method comprising:
   forming a plurality of microLEDs on a substrate;
   disposing a continuous layer of beam splitter in physical contact with top and side surfaces of the plurality of microLEDs, wherein continuous layer of the beam splitter comprises a plurality of stacked layers; and disposing a film comprising a plurality of quantum dots in physical contact with the continuous layer of beam splitter.

2. The method of claim 1, wherein each of the plurality of microLEDs is configured to emit light only in a blue wavelength range.

3. The method of claim 1, wherein the disposing the continuous layer of beam splitter comprises disposing a compound laminate structure that includes the plurality of layers.

4. The method of claim 1, wherein the plurality of stacked film layers are formed from an extruded polymer.

5. The method of claim 1, wherein the disposing continuous layer of the beam splitter comprises depositing layers of material using chemical vapor deposition (CVD).

6. The method of claim 5, wherein the material includes titanium dioxide, tantalum pentoxide, or silicon dioxide.

7. The method of claim 1, wherein the disposing the continuous layer of beam splitter comprises depositing layers of material using atomic layer deposition (ALD).

8. The method of claim 7, wherein the material includes titanium dioxide, tantalum pentoxide, or silicon dioxide.

9. The method of claim 1, wherein the disposing the film comprises disposing a first layer, a second layer, and an adhesive material between the first layer and the second layer, the adhesive material comprising the plurality of quantum dots.

10. The method of claim 1, wherein the plurality of layers are disposed such that the continuous layer of beam splitter transmits at least 90% of light having a wavelength between 400 nm and 480 nm and reflects at least 90% of light having a wavelength between 500 nm and 800 nm.

11. The method of claim 1, wherein the forming the plurality of microLEDs comprises forming the plurality of microLEDs in an array.

12. The method of claim 1, wherein the disposing the film comprises disposing the film having a first group of quantum dots of the plurality of quantum dots configured to emit light in a green wavelength range and a second group of quantum dots of the plurality of quantum dots configured to emit light in a red wavelength range.

13. A method of fabricating a display device, comprising:
    forming a plurality of microLEDs on a substrate;
    disposing a continuous layer of beam splitter in physical contact with top and side surfaces of the plurality of microLEDs to transmit light from the plurality of microLEDs; and
    disposing a plurality of quantum dots on the continuous layer of beam splitter.

14. The method of claim 13, wherein the disposing the continuous layer of beam splitter comprises disposing a plurality of layers on the top and side surfaces of the plurality of microLEDs.

15. The method of claim 13, wherein the disposing the continuous layer of beam splitter comprises disposing a first portion of the continuous layer of beam splitter on the substrate and disposing a second portion of the continuous layer of beam splitter on the top and side surfaces of the plurality of microLEDs.

16. The method of claim 13, wherein forming the plurality of microLEDs comprises forming each microLED of the plurality of microLEDs to emit light only in a blue wavelength range.

17. The method of claim 13, wherein the disposing the continuous layer of beam splitter comprises disposing a plurality of layers with refractive indices different from each other.

18. The method of claim 13, further comprising:
    disposing a first layer and a second layer on the continuous layer of beam splitter; and
    disposing an adhesive material between the first layer and the second layer, wherein the adhesive material comprises the plurality of quantum dots.

19. The method of claim 13, wherein the disposing the continuous layer of beam splitter comprises disposing the continuous layer of beam splitter such that at least 90% of light having a wavelength between 400 nm and 480 nm is transmitted and at least 90% of light having a wavelength between 500 nm and 800 nm is reflected.

20. The method of claim 13, wherein the disposing the plurality of quantum dots comprises disposing a first group of quantum dots of the plurality of quantum dots configured to emit light in a green wavelength range and disposing a second group of quantum dots of the plurality of quantum dots configured to emit light in a red wavelength range.

* * * * *